US008024635B2

(12) United States Patent  
Ismail

(10) Patent No.: US 8,024,635 B2  
(45) Date of Patent: Sep. 20, 2011

(54) WIRELESS COMMUNICATIONS SYSTEM

(75) Inventor: Mohamed Rafiq Ismail, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 1215 days.

(21) Appl. No.: 11/534,783

(22) Filed: Sep. 25, 2006

(65) Prior Publication Data  
US 2007/0180345 A1  Aug. 2, 2007

(30) Foreign Application Priority Data

Feb. 1, 2006 (GB) .................................. 0602034.1

(51) Int. Cl.  
*H03M 13/11* (2006.01)

(52) U.S. Cl. .......................................................... 714/752
(58) Field of Classification Search ................... 714/752  
See application file for complete search history.

(56) References Cited

U.S. PATENT DOCUMENTS

| 2003/0023917 | A1* | 1/2003 | Richardson et al. .......... 714/749 |
| 2005/0144549 | A1 | 6/2005 | Kim et al. |
| 2005/0216821 | A1* | 9/2005 | Harada .......................... 714/801 |
| 2005/0257124 | A1* | 11/2005 | Richardson et al. .......... 714/796 |
| 2006/0242093 | A1* | 10/2006 | Richardson et al. ............. 706/15 |
| 2007/0041458 | A1* | 2/2007 | Hocevar et al. ................ 375/260 |
| 2007/0079213 | A1* | 4/2007 | Ismail ........................... 714/758 |
| 2007/0116143 | A1* | 5/2007 | Bjerke et al. .................. 375/262 |

OTHER PUBLICATIONS

Stephan ten Brink, et al., "Design of Low-Density Parity-Check Codes for Modulation and Detection", IEEE Transactions on Communications, vol. 52, No. 4, XP002324882, Apr. 2004, pp. 670-678.

* cited by examiner

*Primary Examiner* — Stephen Baker  
(74) *Attorney, Agent, or Firm* — Oblon, Spivak, McClelland, Maier & Neustadt, L.L.P.

(57) ABSTRACT

Wireless transmission of data is effected across a communications channel defined by a communications medium by means of an encoder, operable to apply a low density parity check (LDPC) code to data for transmission. The LDPC code is irregular with respect to the degree of variable nodes, and so the transmitter further comprises means for sorting encoded data with respect to the corresponding variable node degree, and modulation and distribution means for allocating encoded and sorted data onto the communications medium. The distribution of the data onto the communications medium is carried out with respect to a prior established pre-coding algorithm, such as SVD.

5 Claims, 8 Drawing Sheets

WIRELESS COMMUNICATIONS SYSTEM

This invention relates to apparatus, a method, and source code suitable for use in effecting wireless communications, and particularly directed to wireless communication involving channel coding.

Channel coding is employed in a communications system to afford greater protection from error to the transmitted data. Various channel coding systems exist, several of which result in an expansion of the amount of data required to be transmitted, thereby adding redundancy to the transmission.

A number of encoding-decoding techniques are well documented and commonly found in communication devices. Convolutional coding, turbo coding and parity check coding are a few of the schemes commonly used. "Low-Density Parity-Check Codes." (R. G. Gallager, PhD thesis, 1960, Massachusetts Institute of Technology) describes a method of coding which allows for a comparatively simple decoding scheme. Further refinement on much work has been done on Low Density Parity Check (LDPC) codes, for instance:

"Good codes based on very sparse matrices" (D. Mackay, R. Neal, in BOYD, C (Ed):"Cryptography and Coding". $5^{th}$ IMA Conf., 1995, (Springer), pp. 100-111 (number 1025 in Lecture Notes in Computer Science));

"Near Shannon limit performance of low density parity check codes" (D. Mackay, R. Neal, IEEE Electronics Letters, vol. 33, No. 6, March 1997);

"A linear time erasure-resilient code with nearly optimal recovery" (N. Alon, M. Luby, IEEE Trans. Information Theory, pp. 1732-1736, November 1996);

"Efficient encoding of low-density parity-check codes" (T. J. Richardson, R. Urbanke, IEEE Trans. Information Theory, vol. 47, pp. 638-656, February 2001); and "Design of capacity-approaching irregular low-density parity-check codes" (T. Richardson, A. Shokrollahi, R. Urbanke, IEEE Trans. Information Theory, vol. 47, pp. 619-637, February 2001).

An LDPC code can be expressed as a factor graph, showing the relationship between variable nodes and check nodes. Factor graphs were introduced in "A recursive approach to low complexity codes" (R. M. Tanner, IEEE Trans. Information Theory, pp. 533-547, September 1981) and used also in "An introduction to LDPC Codes" (W. E. Ryan, Handbook for Coding and Signal Processing for Recoding Systems (B. Vasic, ed.), CRC Press, 2004). Factor graphs are also known as Tanner graphs.

LDPC factor graphs can be either regular or irregular. The number of connections to each node is termed the degree of the node. The degree of a variable node determines the relative degree of protection conferred upon that node. The higher the degree of a node the better the capability for correction of an information bit associated with that node. This is because there is more information associated with that node from which the identity of the dropped bit can be determined.

For a regular LDPC factor graph, every variable node is of the same degree, as is every check node. It will be understood by the reader that this does not imply that check nodes and variable nodes are of the same degree—check nodes could be of higher or lower degree than variable nodes.

In contrast, for an irregular LDPC code the degree of the variable nodes and of the check nodes are each necessarily different.

"A Simple Coded Modulation Scheme based on Irregular Low-Density Parity-Check Codes" (K. Harada, M. Mukai, H. Tsurumi, Intl. Symposium on Info. Theory and its Applications, ISITA 2004, Parma, Italy, Oct. 10-13, 2004) describes a method for sorting an LDPC coded sequence based on variable node degree and then mapping to a signal constellation point using a set partitioning technique. This paper demonstrates the benefit of accounting for node degree in establishing an LDPC code.

The benefits of using multiple input and multiple output (MIMO) antennas at the transmitter and receiver are well documented, for example in "A Simple Transmit Diversity Technique for Wireless Communications" (S. M. Alamouti, IEEE JSAC, vol. 16, no. 8, October 1998, pp. 1451-1458) and "Layered Space-time Architecture for Wireless Communication in a Fading Environment When using Multiple Antennas" (C. J. Foschini, Bell Labs Tech. J., vol. 1 no 2, autumn 1996, pp. 41-59).

Further, "Design of Low-Density Parity-Check Codes for Modulation and Detection" (S. ten Brink, G. Kramer, A. Ashikhmin, IEEE Trans. Comms, vol. 52, no. 4, April 2004, pp. 670-678) and "Best Mapping for LDPC Coded Modulation on SISO, MIMO and MAC Channels" (J. Wu, H-N Lee, Proc. IEEE Wireless Communications and Networking Conf., March 2004, pp. 2428-2431) describe the use of codes which can be expressed on factor graphs (of which LDPC codes are an example) within a MIMO system resulting in enhanced performance in comparison with traditional channel coding/MIMO solutions.

Variable node degree distribution information is not currently utilised for assigning which transmit antenna(s), in a MIMO system, a modulated symbol will be transmitted from based on channel information. Similarly, in an OFDM based transmission scheme no account is taken of variable node degree distribution in bit loading the sub-carriers. This is because existing processes require the use of channel state information from the receiver, which introduces further processing overhead to the system.

A first aspect of the invention provides a wireless transmitter for transmitting data in a communications channel defined in a communications medium, the transmitter comprising an encoder, operable to apply a low density parity check (LDPC) code to data for transmission, the LDPC code being irregular with respect to the degree of variable nodes, sorting means for sorting encoded data with respect to the corresponding variable node degree, and modulation and distribution means for allocating encoded and sorted data onto the communications medium, the distribution means being operable to distribute the sorted data onto the communications medium in accordance with a predetermined preceding algorithm, such that the distribution order can be determined by a receiver without recourse to side information.

Corresponding methods of transmitting, and receivers and methods of receiving, are also contemplated as being in accordance with aspects of the invention.

A second aspect of the invention provides a wireless receiver for receiving and decoding data transmitted in a communications channel defined in a communications medium, the receiver comprising demodulation means operable to demodulate data from a plurality of data streams, in accordance with a predetermined distribution algorithm, de-sorting means for reverting the received data to an unsorted condition, and a decoder operable to apply an LDPC parity check to decode the received, de-sorted data.

A third aspect of the invention provides a method of transmitting data in a communications channel, the method comprising applying a low density parity check (LDPC) code to data for transmission, the LDPC code being irregular with respect to the degree of variable nodes, sorting encoded data with respect to the corresponding variable node degree, and allocating encoded and sorted data onto the communications channel in accordance with a predetermined precoding algorithm, such that the distribution order can be determined by a receiver without recourse to side information.

A fourth aspect of the invention provides a method of receiving and decoding data transmitted in a communications channel defined in a communications medium, the method comprising demodulating data from a plurality of data streams, in accordance with a predetermined distribution algorithm, reverting the received data to an unsorted condition, and applying an LDPC parity check to decode the received, de-sorted data.

Moreover, while provision of original equipment in accordance with the invention is envisaged, it will also be appreciated that all of these aspects of the invention can be fulfilled by provision of suitable computer programmable communications means, and a computer program, which may be in the form of a software product supplied on a storage medium or as a downloadable file or collection of files.

Further aspects, features and advantages of the invention will now be described by means of specific embodiments of the invention, provided by way of example only, with reference to the accompanying drawings in which.

Figure 1:
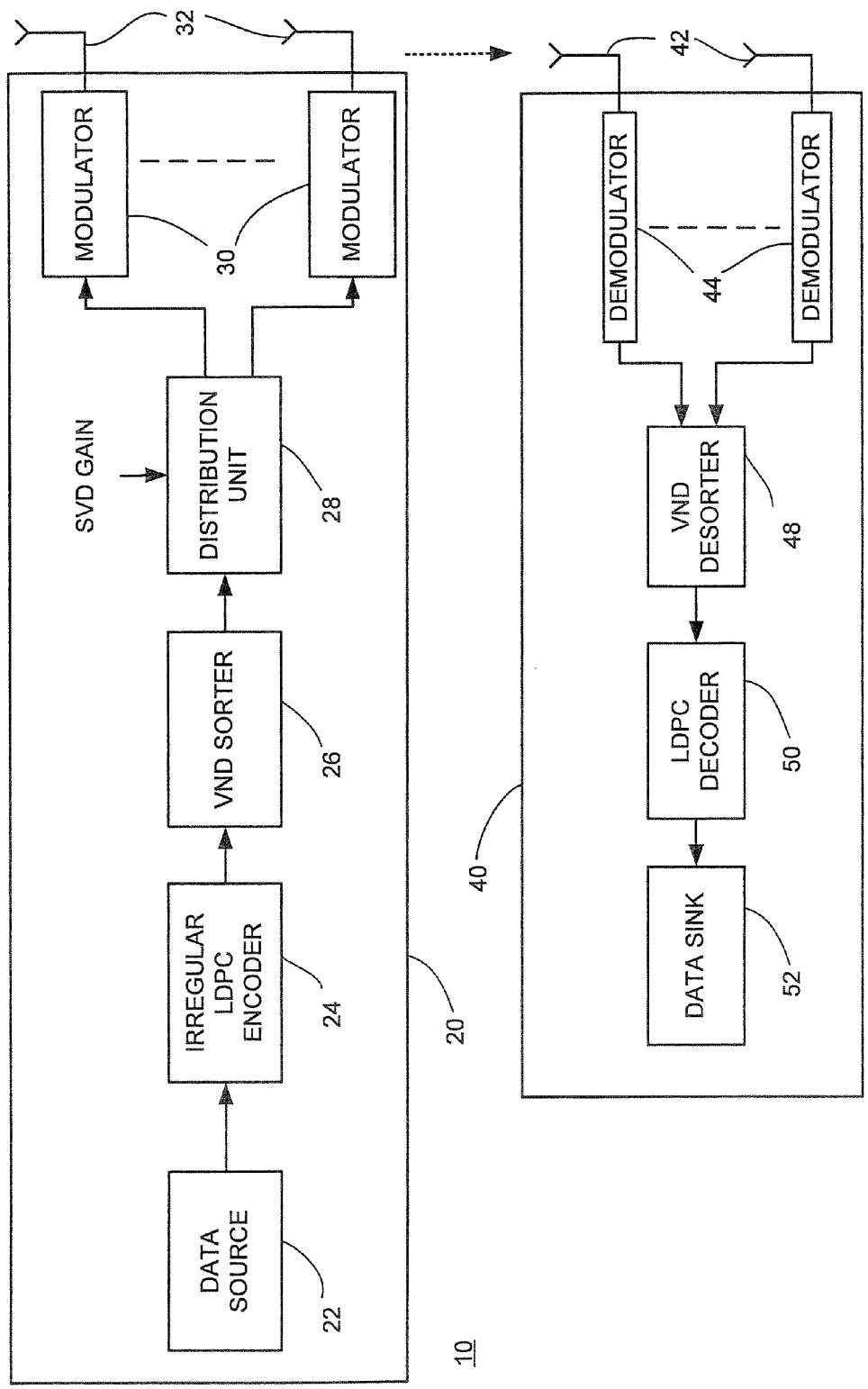
FIG. 1 illustrates a communications system including a MIMO transmitter in accordance with an embodiment of the invention, together with a receiver suitable for use therewith.

With reference to the drawings, a first embodiment of the invention is illustrated in FIG. 1. A simplified MIMO communications system 10 is depicted, comprising a transmitter 20 and a receiver 40. The transmitter 20 and the receiver 40 are shown as units dedicated to transmission and reception respectively, but it will be appreciated that, in use, a communications device will comprise elements of both in order to effect bidirectional communication.

It will be appreciated that, though the invention is described in the context of MIMO transmission, the invention is equally applicable to other transmission modes.

The transmitter 20 comprises a data source 22, which may be any hardware and/or software components generating data for transmission, an irregular LDPC encoder 24, a VND sorter 26, a distribution unit 28, an array of modulators 30 and a corresponding array of antennas 32.

Figure 6:
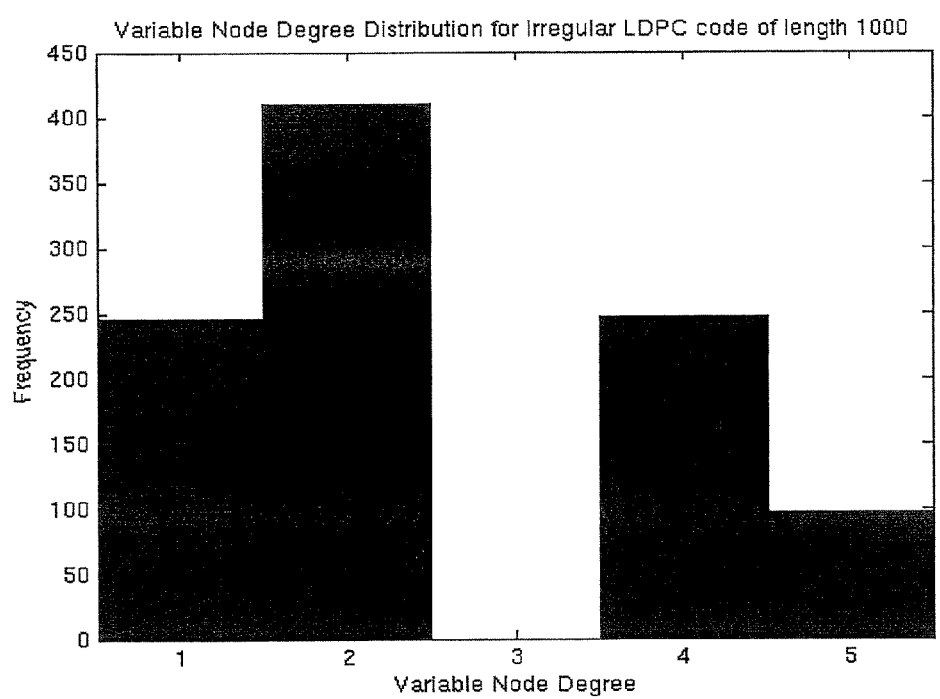
FIG. 6 illustrates variable node degree distribution for an irregular LDPC code of length 1000 bits.

The irregular LDPC encoder 24 determines an LDPC code and applies this to the data to be transmitted, in accordance with the LDPC code (which, as described above, can be expressed by means of a factor graph). FIG. 6 illustrates, by way of example, the variable node degree distribution for an irregular LDPC code of length 1000 bits. For example, in a 2×2 SVD system employing BPSK modulation bits with variable degree one and two could be allocated to stream 1 and bits with degree four and five to stream 2.

For higher order modulation schemes bits of similar degree need to be grouped together prior to modulation. This is achieved by pre-sorting the data stream based upon each bit's variable node degree.

Figure 7:
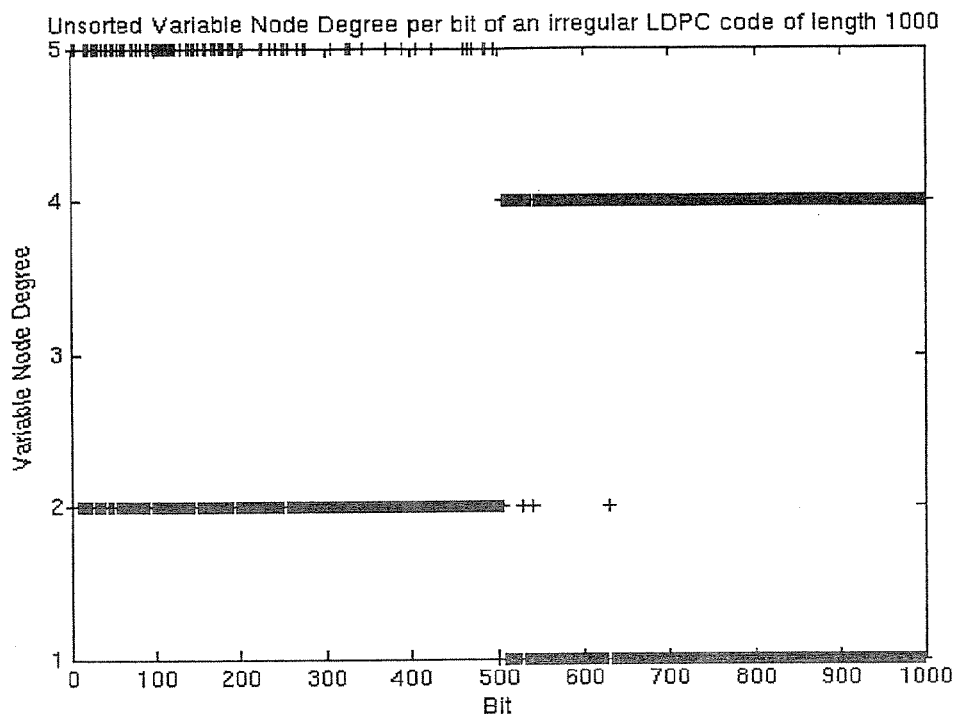
FIG. 7 illustrates variable node degree of a 1000 bit length irregular LDPC code prior to sorting.
Figure 8:
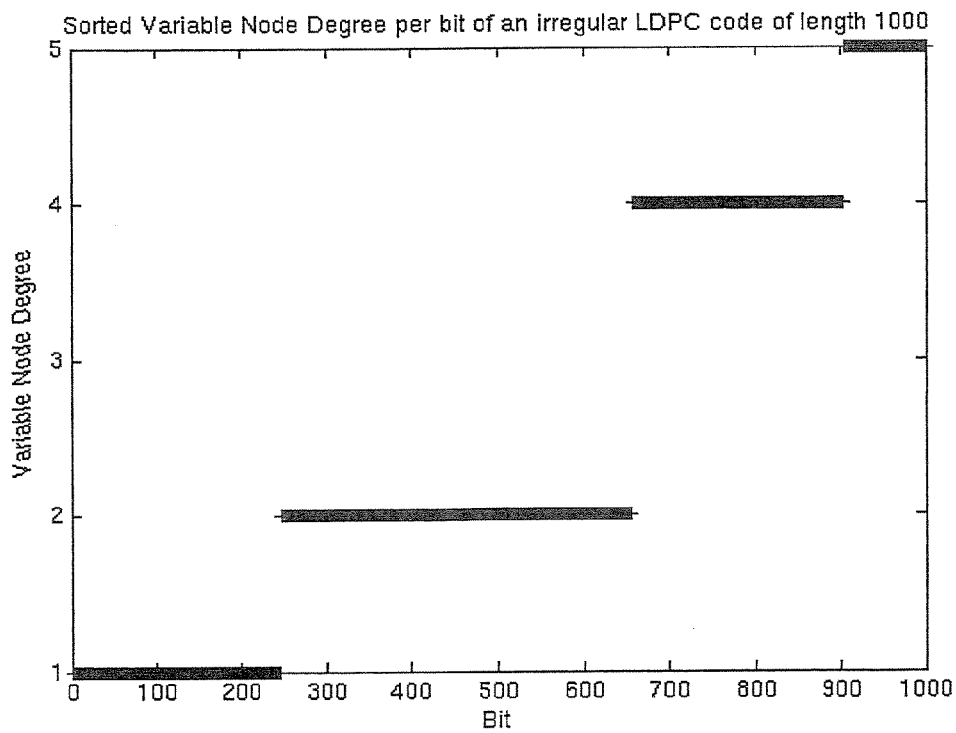
FIG. 8 illustrates the variable node degree of the code illustrated in FIG. 7, after sorting.

Thus, following application of the irregular LDPC code, the encoded data is passed to a variable node degree (VND) sorter 26, which sorts the bits of the encoded data by reference to the degree of the variable node on which each bit is encoded. This results in bits encoded on a low degree variable node being ordered ahead of bits encoded on a high degree variable node. FIG. 7 shows the variable node degree of a 1000 bit length irregular LDPC code prior to sorting. FIG. 8 shows the same information after a sorting operation. The sorted bits of FIG. 8 may be used in higher order modulation schemes thereby grouping together bits of similar degree for each modulated symbol.

Of course, it will be appreciated by the reader that the reverse could alternatively be provided, that the VND sorter could be configured to sort the bits of the encoded data by reference to the degree of the variable node, such that the bits on a high degree variable node are ordered ahead of the bits on lower degree variable nodes.

The ordered data is then passed to the distribution unit 28 which acts, under the instruction of SVD Gain information determined for the channel. This channel information can be derived in a number of different ways, as will be appreciated by the reader. For example the channel may be assumed to be reciprocal in that the channel response as seen by the receiver and the transmitter is the same. Alternatively, an explicit path could be used from receiver to transmitter for communication of the required information.

Figure 2:
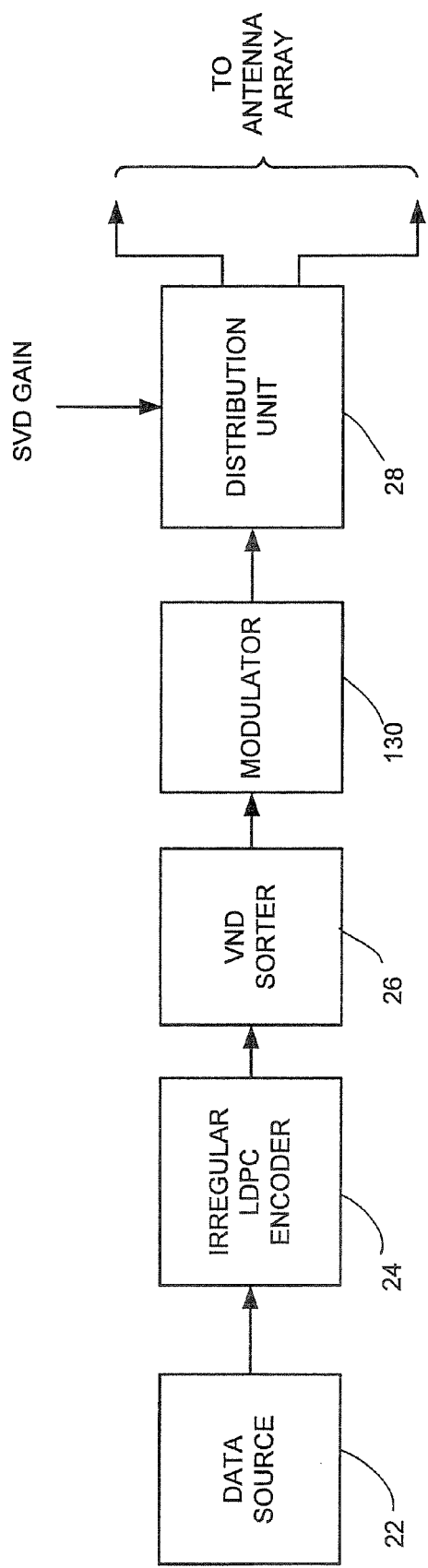
FIG. 2 illustrates a transmitter encoding train in accordance with a second embodiment of the invention.

The Distribution Unit (DU) multiplexes symbols according to their relative variable node degree onto the appropriate SVD stream. Relatively higher degree symbols are routed to the stream with lower gain and vice versa, though of course any judicious combination may be applied. In FIG. 2 (described in detail below) all symbols have the same modulation applied with the DU multiplexing the symbols based on their degree and the stream gains. In FIG. 1 the DU multiplexes bits based on their degree and the stream gain with modulation being applied thereafter.

In the case of FIG. 1, different modulation can be applied on each stream. Another embodiment could also take into account the relative bit reliability for each of the different modulation schemes present on each of the streams to allocate the sorted symbols. The bit reliabilities could, for example, be calculated assuming each stream is an Additive White Gaussian Noise (AWGN) channel for which analytical probability of error expressions exist based upon the modulation scheme and Signal-to-Noise (SNR) ratio being used.

A transmission is thus effected onto the MIMO channel, and this is detected at the receiver 40 by means of an antenna array 42. The signals received at the antennas 42 are then demodulated using a corresponding bank of demodulators 44.

The VND de-sorter 48 then passes the demodulated information to an LDPC decoder 50 which extracts the original information and passes this to a data sink 52 where the data is received and is available for user interaction.

The operation of the VND de-sorter is effected not by means of side information borne with the transmitted data, but by means of the LDPC parity check matrix which the receiver holds from the outset. It will be appreciated that, as a condition of compatibility between a transmitter and a receiver in a system according to this embodiment of the invention, a receiver will store information defining the LDPC parity check matrix to match that applied by the transmitter.

Further configurations of the encoding train used in the transmitter of FIG. 1 will now be described with reference to FIGS. 2, 3 and 4 for the assistance of the reader in understanding the scope of the invention. Where components have substantially the same function as those illustrated in FIG. 1, they are given the same reference numbers. For reasons of clarity, the overall structure of the transmitter, such as the data source 22, is omitted.

In FIG. 2, the series of modulators 30 in FIG. 1 is replaced by a single modulator 130, interposed between the VND sorter 26 and the distribution unit 28. The distribution unit 28 again allocates symbols to one of n subcarriers 131 defined on an array of antennas 32 based on SVD gain. In a particular example of implementation of this embodiment, the subcarriers can be defined by an array of 2 antennas.

Figure 3:
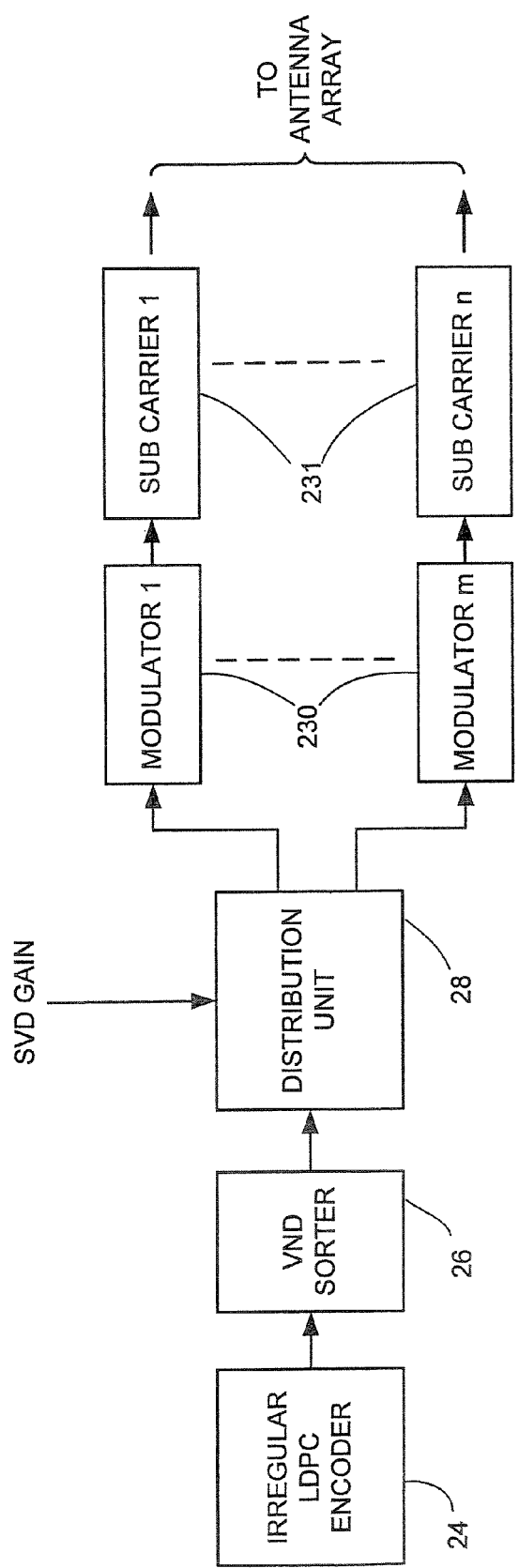
FIG. 3 illustrates a transmitter encoding train in accordance with a third embodiment of the invention.
Figure 4:
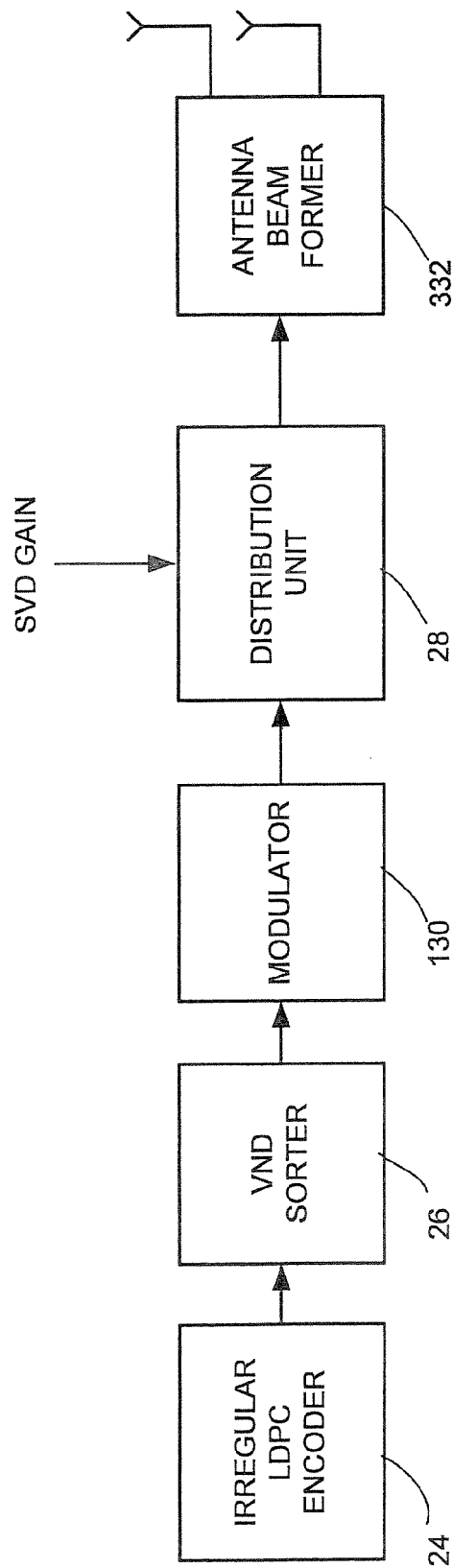
FIG. 4 illustrates a transmitter encoding train in accordance with a third embodiment of the invention.

In FIG. 3, the distribution unit 28 allocates bits to one of a series of m distinct modulators 230, preceding n subcarriers 231. m is less than or equal to n. The distribution unit 28 again operates on the basis of SVD gain.

It will be understood that distribution configuration information could alternatively be derived from sources other than the receiver.

It will be further understood that the pairing of modulator and antenna is but one arrangement within the scope of the invention. Alternative arrangements are also possible. For example, a beamforming block could be provided to interpose between modulators and antennas, so that one to one correspondence is not required. FIG. 4 illustrates this in further detail—the first four stages of the arrangement illustrated in FIG. 2 are replicated but then a beam-former 332 interposes between the modulator and the antenna array. In that way, the subcarriers defined in the transmitter are translated to the antennas.

The combination of VND sorter and distribution unit (DU) facilitates exploitation of the irregular protection offered to information bits by the distribution of degree among the variable nodes of the Tanner graph defining the LDPC scheme.

Figure 5:
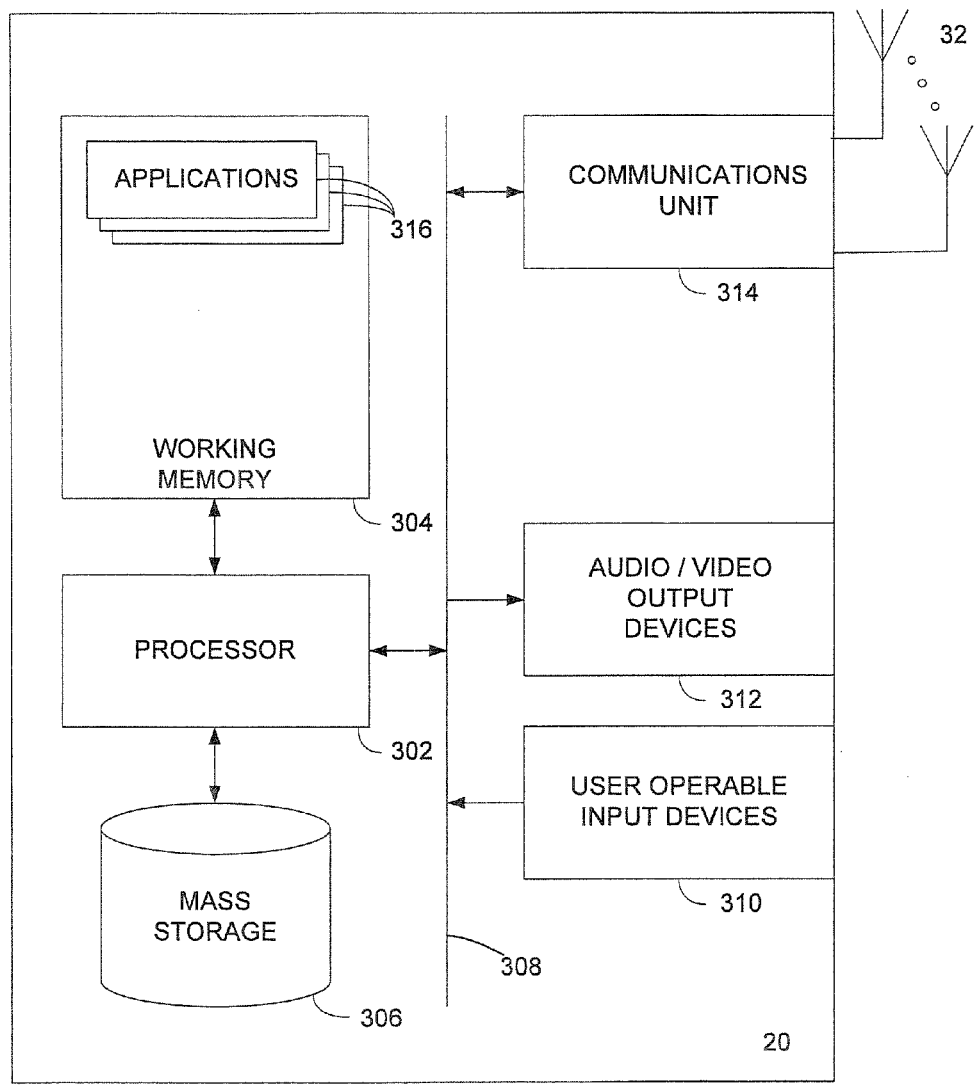
FIG. 5 illustrates a communications device configured in accordance with the transmitter of the first described embodiment.

FIG. 5 illustrates schematically a wireless communications device configured as the transmitter 20 according to the first embodiment of the present invention. The device 20 comprises a processor 302 operable to execute machine code instructions stored in a working memory 304 and/or retrievable from a mass storage device 306. By means of a general-purpose bus 308, user operable input devices 310 are in communication with the processor 302. The user operable input devices 310 comprise, in this example, a keyboard, but could include a mouse or other pointing device such as a touchpad, a contact sensitive surface on a display unit of the device, a writing tablet, speech recognition means, haptic input means, or any other means by which a user input action can be interpreted and converted into data signals.

Audio/video output devices 312 are further connected to the general-purpose bus 308, for the output of information to a user. Audio/video output devices 312 include a visual display unit, and a speaker, but can also include any other device capable of presenting information to a user.

A communications unit 314 is connected to the general-purpose bus 308, and further connected to a series of antennas 32. By means of the communications unit 314 and the antennas 32, the device 20 is capable of establishing wireless communication with another device. The communications unit 314 is operable to convert data passed thereto on the bus 308 to an RF signal carrier in accordance with a communications protocol previously established for use by a system in which the device 20 is appropriate for use.

In the device 20 of FIG. 1, the working memory 304 stores user applications 316 which, when executed by the processor 302, cause the establishment of a user interface to enable communication of data to and from a user. The applications 316 thus establish general purpose or specific computer implemented utilities and facilities that might habitually be used by a user.

Conventional LDPC based MIMO or OFDM systems do not explicitly account for the non-uniform distribution of variable node degree. Specifically, existing methods do not marry irregular variable node degree with other factors that may affect the error probability of a transmission.

Figure 9:
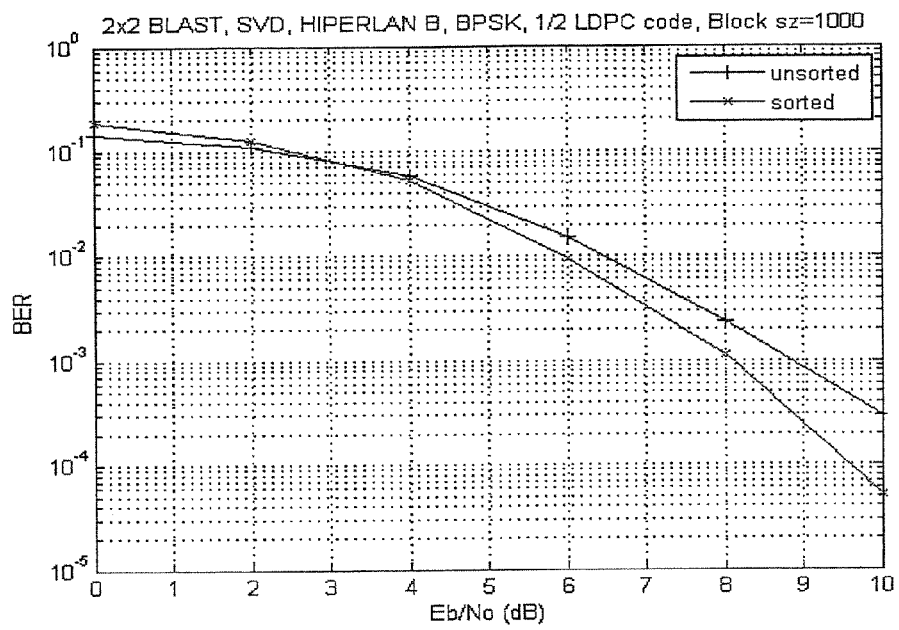
FIGS. 9 and 10 illustrate experimental results obtained from a computer based simulation of an embodiment of the invention.
Figure 10:
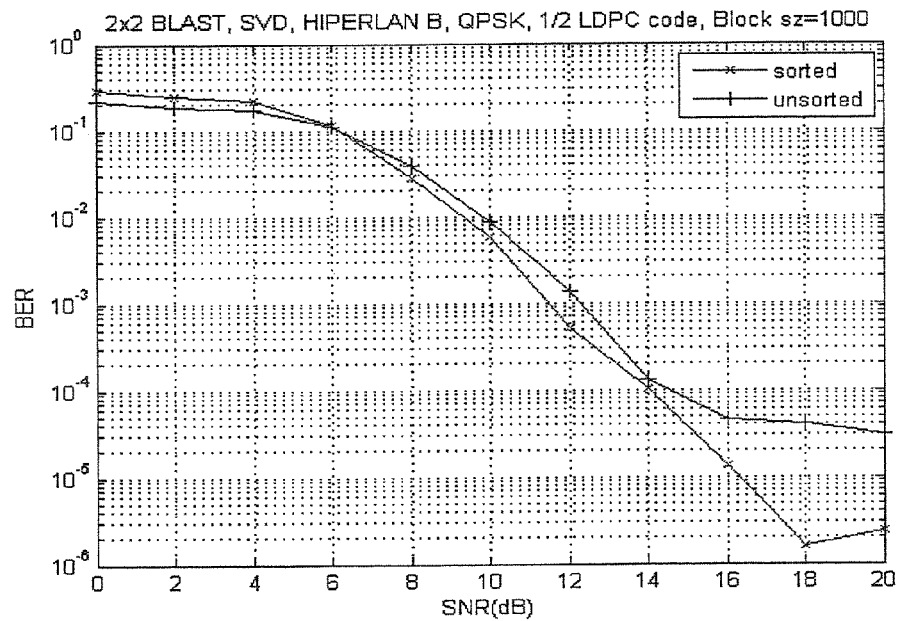

FIGS. 9 and 10 illustrate results derived from a computer simulation of the described embodiment, performed to allow for comparison between the described sorting/multiplexing method and a conventional method which did not use this approach.

Results were obtained for both BPSK and QPSK modulation schemes in an OFDM system similar to the proposed 802.11n standard. A 2×2 BLAST system was simulated in a MIMO channel (HIPERLAN B) corresponding to a typical large open space and office environment. A ½ rate LDPC code of length 1000 coded bits was used. FIG. 9 shows the result for a BPSK modulation scheme comparing the proposed "sorted" scheme with a conventional "unsorted" scheme. FIG. 10 shows the comparison for a QPSK modulation scheme.

For both BPSK and QPSK modulation a significant improvement is observed by using the proposed "sorted" method, seeing a gain of approximately 0.8 dB at a bit error rate of 10E-3. Furthermore, the gain in performance increases as the Signal-to-Noise Ratio (SNR) increases until an error floor is reached.

In particular, whereas the channel coding mechanism of conventional systems does not account for the vulnerability or sensitivity of the incoming data to errors, the present invention does. Similarly, conventional channel encoding schemes do not account for the transient conditions of the communications channel. Moreover, using SVD (by way of example) to drive the distribution of data to the streams defined in the channel avoids the need for the transmission of side information, given suitable configuration of the receiver to reverse the distribution algorithm.

Furthermore, while the invention is described in the context of a MIMO system, it will be understood that the invention is not limited in scope to application to MIMO arrangements.

Moreover, while the invention has been described above with regard to a specific embodiment employing OFDM technology, it will be appreciated that this is not essential to the delivery of the invention, and the determination of sub-carriers in the communications medium is also not an essential element of the invention.

The reader will further appreciate that the use of SVD is not an essential element of the invention and another transform, particularly another preceding transform, could be used to achieve the same technical advantage. For example, a precoding technique such as any "decomposition" type of method that reduces the channel matrix into a set of full-rank orthogonal vectors may be employed.

The invention is not to be considered limited in any way to the foregoing description of a specific embodiment thereof, or variations thereto, but is to be understood from the appended claims.

The invention claimed is:

1. A wireless transmitter for transmitting data in a communications channel defined in a communications medium, the transmitter comprising an encoder, operable to apply a low density parity check (LDPC) code to data for transmission, the LDPC code being irregular with respect to the degree of variable nodes, a sorting unit operable to sort encoded data with respect to the corresponding variable node degree, and modulation and a distribution unit operable to allocate encoded and sorted data onto the communications medium, the distribution unit being operable to distribute the sorted data onto the communications medium in accordance with a predetermined precoding algorithm, such that the distribution order can be determined by a receiver without any transmission of side information; and wherein the distribution unit is operable to distribute the sorted data onto the communications medium in accordance with singular value decomposition of a matrix representing the communications channel.

2. A wireless transmitter in accordance with claim 1 wherein the transmitter is for use in a MIMO based system.

3. A wireless transmitter in accordance with claim 1 wherein the transmitter is for use in an OFDM system.

4. A wireless transmitter in accordance with claim 1 wherein the distribution unit is operable to distribute the sorted data onto streams in the communications channel, defined by means of the singular value decomposition, with reference to the degree of the respective variable nodes of the LDPC coding.

5. A wireless transmitter in accordance with claim 4 wherein the distribution unit is operable to distribute relatively higher degree symbols onto an SVD stream of relatively lower gain.

* * * * *